(12) United States Patent
Kobrin et al.

(10) Patent No.: US 10,900,123 B2
(45) Date of Patent: *Jan. 26, 2021

(54) APPARATUS AND METHOD FOR CONTROLLED APPLICATION OF REACTIVE VAPORS TO PRODUCE THIN FILMS AND COATINGS

(71) Applicant: SPTS Technologies Ltd., Newport (GB)

(72) Inventors: Boris Kobrin, Walnut Creek, CA (US); Romuald Nowak, Cupertino, CA (US); Richard C. Yi, Santa Cruz, CA (US); Jeffrey D. Chinn, Foster City, CA (US)

(73) Assignee: SPTS Technologies Limited, Newport (GB)

( * ) Notice: Subject to any disclaimer, the term of this patent is extended or adjusted under 35 U.S.C. 154(b) by 299 days.

This patent is subject to a terminal disclaimer.

(21) Appl. No.: 15/672,163

(22) Filed: Aug. 8, 2017

(65) Prior Publication Data

US 2017/0335455 A1 Nov. 23, 2017

Related U.S. Application Data

(63) Continuation of application No. 11/445,706, filed on Jun. 2, 2006, now Pat. No. 9,725,805, which is a (Continued)

(51) Int. Cl.
*C23C 16/455* (2006.01)
*B05D 1/00* (2006.01)
(Continued)

(52) U.S. Cl.
CPC .......... *C23C 16/45557* (2013.01); *B05D 1/60* (2013.01); *B82Y 30/00* (2013.01); (Continued)

(58) Field of Classification Search
CPC ........ C23C 16/45557; C23C 16/45561; C23C 16/4485; B05D 1/60; B05D 3/142; B82Y 30/00
See application file for complete search history.

(56) References Cited

U.S. PATENT DOCUMENTS 4,717,596 A * 1/1988 Barbee ................ C23C 16/4485
118/50
5,459,099 A 10/1995 Hsu
(Continued)

FOREIGN PATENT DOCUMENTS

JP S62107071 A 5/1987
JP H0414440 A 1/1992
(Continued)

OTHER PUBLICATIONS

Teshima et al., "Gas Battier Performance of Surface-Modified Silica Films with Grafted Organosilane Molecules," Langmuir, 2003, 19, 20, abstract.
(Continued)

*Primary Examiner* — Jeffrie R Lund
(74) *Attorney, Agent, or Firm* — Hodgson Russ LLP (57) ABSTRACT

An apparatus for vapor deposition of thin film coatings, including: a process controller; a plurality of precursor containers into which a plurality of coating precursors, each in the form of a liquid or a solid, are respectively placed; a plurality of precursor vapor reservoirs, each in communication with a respective one of said precursor containers; a plurality of in-line devices which control a vapor flow of a coating precursor vapor from one of said precursor containers into one of said precursor vapor reservoirs with which said precursor container is in communication upon receipt of a signal from said process controller; a plurality of precursor control valves which control vapor flow from said precursor vapor reservoir upon receipt of a signal from said process (Continued)

controller; and a process chamber for vapor deposition of said coating on a substrate when present in said process chamber.

16 Claims, 3 Drawing Sheets

Related U.S. Application Data continuation of application No. 10/759,857, filed on Jan. 17, 2004, now abandoned.

(60) Provisional application No. 60/509,563, filed on Oct. 9, 2003.

(51) Int. Cl.
*B82Y 30/00* (2011.01)
*C23C 16/448* (2006.01)
*B05D 3/14* (2006.01)

(52) U.S. Cl.
CPC .... *C23C 16/4485* (2013.01); *C23C 16/45561* (2013.01); *B05D 3/142* (2013.01)

(56) References Cited

U.S. PATENT DOCUMENTS

| | | | | |
|---|---|---|---|---|
| 5,480,488 A * | 1/1996 | Bittner | | C23C 16/448 118/666 |
| 5,576,247 A * | 11/1996 | Yano | | H01L 21/3105 438/760 |
| 5,602,671 A * | 2/1997 | Hornbeck | | B81B 3/0005 310/40 MM |
| 5,607,789 A | 3/1997 | Treger et al. | | |
| 5,620,910 A | 4/1997 | Teramoto | | |
| 5,626,924 A * | 5/1997 | Ishikawa | | C23C 16/402 427/579 |
| 5,645,642 A * | 7/1997 | Nishizato | | C23C 16/4481 118/692 |
| 5,681,666 A | 10/1997 | Treger et al. | | |
| 5,693,139 A * | 12/1997 | Nishizawa | | C23C 16/455 117/89 |
| 5,736,207 A | 4/1998 | Walther et al. | | |
| 5,766,498 A * | 6/1998 | Kojima | | H01J 37/32009 216/71 |
| 5,879,459 A * | 3/1999 | Gadgil | | C23C 16/44 118/715 |
| 5,916,365 A * | 6/1999 | Sherman | | C23C 16/452 117/92 |
| 5,966,499 A * | 10/1999 | Hinkle | | B01J 4/00 118/715 |
| 5,972,430 A * | 10/1999 | DiMeo, Jr. | | C23C 16/45531 427/255.31 |
| 5,989,345 A * | 11/1999 | Hatano | | C23C 16/4485 118/715 |
| 6,051,448 A | 4/2000 | Hayama et al. | | |
| 6,090,442 A | 7/2000 | Klaus et al. | | |
| 6,197,471 B1 * | 3/2001 | Graham | | C23C 14/165 204/192.23 |
| 6,203,505 B1 * | 3/2001 | Jalisi | | A61L 29/085 600/585 |
| 6,383,642 B1 * | 5/2002 | Le Bellac | | B05D 1/62 427/162 |
| 6,391,803 B1 | 5/2002 | Kim et al. | | |
| 6,436,203 B1 * | 8/2002 | Kaizuka | | C23C 16/18 148/512 |
| 6,443,435 B1 | 9/2002 | Hendrickson | | |
| 6,503,330 B1 * | 1/2003 | Sneh | | C23C 16/02 118/715 |
| 6,576,489 B2 * | 6/2003 | Leung | | B81B 3/0005 216/2 |
| 6,743,516 B2 | 6/2004 | Murphy et al. | | |
| 6,743,736 B2 * | 6/2004 | Mardian | | C23C 16/455 118/715 |
| 6,905,549 B2 * | 6/2005 | Okuda | | C23C 16/45523 118/715 |
| 7,413,774 B2 * | 8/2008 | Kobrin | | B05D 1/60 427/248.1 |
| 7,638,167 B2 * | 12/2009 | Kobrin | | B82Y 30/00 427/248.1 |
| 7,687,110 B2 * | 3/2010 | Kobrin | | C23C 16/4402 427/248.1 |
| 7,695,775 B2 * | 4/2010 | Kobrin | | B05D 1/60 427/255.7 |
| 7,776,396 B2 * | 8/2010 | Kobrin | | B05D 1/185 427/255.29 |
| 7,879,396 B2 * | 2/2011 | Kobrin | | B05D 1/60 29/890.142 |
| 7,942,970 B2 * | 5/2011 | Park | | C01B 21/0602 117/200 |
| 7,955,704 B2 * | 6/2011 | Lowery | | A61L 27/34 428/333 |
| 8,067,258 B2 * | 11/2011 | Chinn | | B81C 1/00896 438/48 |
| 8,178,162 B2 * | 5/2012 | Kobrin | | B82Y 30/00 427/248.1 |
| 8,298,614 B2 * | 10/2012 | Kobrin | | B05D 1/185 427/248.1 |
| 8,323,723 B2 * | 12/2012 | Lowery | | A61L 27/34 427/2.1 |
| 8,545,972 B2 * | 10/2013 | Kobrin | | B05D 1/185 428/215 |
| 8,987,029 B2 * | 3/2015 | Chinn | | B81C 1/00896 438/48 |
| 9,725,805 B2 * | 8/2017 | Kobrin | | B05D 1/60 |
| 2001/0028924 A1 * | 10/2001 | Sherman | | C23C 16/452 427/255.28 |
| 2002/0011210 A1 * | 1/2002 | Satoh | | C23C 16/4405 118/715 |
| 2002/0033229 A1 * | 3/2002 | Lebouitz | | H01J 37/3244 156/345.12 |
| 2002/0076507 A1 * | 6/2002 | Chiang | | C23C 16/0227 427/569 |
| 2002/0146725 A1 * | 10/2002 | Mullen | | B01J 19/0046 435/6.12 |
| 2002/0164420 A1 * | 11/2002 | Derderian | | C23C 16/4481 427/248.1 |
| 2002/0195950 A1 * | 12/2002 | Mikhael | | C23C 16/30 315/111.21 |
| 2003/0013302 A1 * | 1/2003 | Nguyen | | H01L 21/28562 438/687 |
| 2003/0033984 A1 * | 2/2003 | Carpenter | | C23C 16/455 118/725 |
| 2003/0035904 A1 * | 2/2003 | Hsieh | | H01L 21/312 427/569 |
| 2003/0040173 A1 * | 2/2003 | Fonash | | B01J 19/0093 438/622 |
| 2003/0049375 A1 * | 3/2003 | Nguyen | | C23C 16/34 427/255.28 |
| 2003/0138645 A1 * | 7/2003 | Gleason | | B05D 1/60 428/447 |
| 2003/0161949 A1 * | 8/2003 | Ashurst | | B05D 1/60 427/248.1 |
| 2003/0180458 A1 * | 9/2003 | Sneh | | C23C 16/4412 427/248.1 |
| 2004/0015300 A1 * | 1/2004 | Ganguli | | C23C 16/4481 702/24 |
| 2004/0026374 A1 * | 2/2004 | Nguyen | | H01L 21/67173 216/89 |
| 2004/0124131 A1 * | 7/2004 | Aitchison | | B01D 45/06 210/252 |
| 2004/0182316 A1 * | 9/2004 | Watanabe | | C23C 16/4401 118/715 |
| 2004/0194701 A1 * | 10/2004 | Yadav | | C23C 16/402 118/715 |
| 2004/0261703 A1 * | 12/2004 | Kobrin | | B05D 1/60 118/715 |
| 2005/0011434 A1 | 1/2005 | Couillard et al. | | |

(56) References Cited

U.S. PATENT DOCUMENTS

| | | | |
|---|---|---|---|
| 2005/0081787 A1* | 4/2005 | Im | C23C 16/45544 118/715 |
| 2005/0109277 A1* | 5/2005 | Kobrin | B05D 1/60 118/715 |
| 2005/0271809 A1* | 12/2005 | Kobrin | B82Y 30/00 427/248.1 |
| 2005/0271810 A1* | 12/2005 | Kobrin | B05D 1/60 427/248.1 |
| 2005/0271893 A1* | 12/2005 | Kobrin | B05D 1/185 428/633 |
| 2005/0271900 A1* | 12/2005 | Kobrin | B05D 1/185 428/701 |
| 2006/0016427 A1* | 1/2006 | Uda | F02D 9/1095 123/399 |
| 2006/0029732 A1* | 2/2006 | Kobrin | B05D 1/60 427/248.1 |
| 2006/0088666 A1* | 4/2006 | Kobrin | B05D 1/60 427/569 |
| 2006/0201425 A1* | 9/2006 | Kobrin | C23C 16/4402 118/715 |
| 2006/0213441 A1* | 9/2006 | Kobrin | B05D 1/60 118/715 |
| 2006/0251795 A1* | 11/2006 | Kobrin | A61L 27/34 427/2.1 |
| 2007/0020392 A1* | 1/2007 | Kobrin | B05D 1/185 427/249.1 |
| 2007/0213143 A1* | 9/2007 | Chinn | A63B 37/0022 473/351 |
| 2007/0281492 A1* | 12/2007 | Chinn | B81C 1/00896 438/725 |
| 2008/0026146 A1* | 1/2008 | Kobrin | B05D 1/185 427/255.6 |
| 2008/0081151 A1* | 4/2008 | Kobrin | B05D 1/185 428/141 |
| 2008/0083329 A1* | 4/2008 | Kobrin | C23C 16/4402 95/20 |
| 2008/0274281 A1* | 11/2008 | Kobrin | B05D 1/60 427/255.7 |
| 2010/0075034 A1* | 3/2010 | Kobrin | B82Y 30/00 427/248.1 |
| 2010/0137984 A1* | 6/2010 | Lowery | A61L 27/34 623/6.62 |
| 2010/0304132 A1* | 12/2010 | Kobrin | B05D 1/185 428/336 |
| 2011/0052808 A1* | 3/2011 | Kobrin | B05D 1/185 427/255.6 |
| 2011/0217449 A1* | 9/2011 | Lowery | A61L 27/34 427/2.24 |
| 2012/0045884 A1* | 2/2012 | Chinn | B81C 1/00896 438/460 |
| 2013/0312663 A1* | 11/2013 | Khosla | C23C 16/4485 118/710 |
| 2017/0335455 A1* | 11/2017 | Kobrin | B05D 1/60 |

FOREIGN PATENT DOCUMENTS

| | | | |
|---|---|---|---|
| JP | H0645256 A | 2/1994 | |
| JP | H06045256 A | 2/1994 | |
| JP | H0697163 A | 4/1994 | |
| JP | H09296269 A | 11/1997 | |
| JP | H110194781 A | 7/1998 | |
| JP | 110306377 A | 11/1998 | |
| JP | H10513003 A | 12/1998 | |
| JP | H11274602 A | 10/1999 | |
| JP | 2001074908 A | 3/2001 | |
| JP | 2002270923 A | 9/2002 | |
| JP | 2003089163 A | 3/2003 | |
| JP | 2003226977 A | 8/2003 | |
| JP | 2003231202 A | 8/2003 | |
| JP | 2003276110 A | 9/2003 | |
| JP | 2003276111 A | 9/2003 | |
| JP | 2004131314 A | 4/2004 | |
| JP | 200114533 A | 4/2011 | |
| JP | 1928940 B2 | 5/2012 | |
| WO | WO-0228956 A1 * | 4/2002 | .......... C03C 17/009 |
| WO | 2005010964 A2 | 2/2005 | |

OTHER PUBLICATIONS

Ashurst et al, "Improved vapor-phase deposition technique for antistiction monolayers," Proceedings of Micromachining and Microfabrication Process Technology, Dec. 30, 2003, pg:205-206, vol. 5342, issue 9, SPIE Digital Library, USA.

Hausmann et al, "Atomic Layer Deposition of Hafnium and Zirconium Oxides Using Metal Amide Precursors," Chemistry of Materials, Sep. 21, 2002, pp. 4350-4358, vol. 14, Issue 10, American Chemical Scoiety, USA.

Teshima et al., "Gas Battier Performance of Surface-Modified Silica Films with Grafted Organosilane Molecules," Langmuir, 2003, 19, 8331-8334.

* cited by examiner

APPARATUS AND METHOD FOR CONTROLLED APPLICATION OF REACTIVE VAPORS TO PRODUCE THIN FILMS AND COATINGS

This application claims priority as a continuation of application Ser. No. 11/445,706, filed Jun. 2, 2006 (now U.S. Pat. No. 9,725,805), entitled: "Apparatus and method for controlled application of reactive vapors to produce thin films and coatings," which is a continuation of application Ser. No. 10/759,857, filed Jan. 17, 2004 (now abandoned), and entitled "Apparatus and method for controlled application of reactive vapors to produce thin films and coatings." Application Ser. No. 10/759,857 claims priority to Provisional Application Ser. No. 60/482,861, filed Jun. 27, 2003 and entitled: "Method And Apparatus for Mono-Layer Coatings"; Provisional Application Ser. No. 60/506,864, filed Sep. 30, 2003, and entitled: "Method Of Thin Film Deposition"; and Provisional Application Ser. No. 60/509,563, filed Oct. 9, 2003, and entitled: "Method of Controlling Monolayer Film Properties." The disclosures of these applications are incorporated by reference herein.

BACKGROUND OF THE INVENTION

1. Field of the Invention

The present invention pertains to apparatus and a method useful in the deposition of a coating on a substrate, where the coating is formed from chemically reactive species present in a vapor which is reacted with the substrate surface.

2. Brief Description of the Background Art

Both integrated circuit (IC) device fabrication and microelectromechanical systems (MEMS) fabrication make use of layers or coatings of material which are deposited on a substrate for various purposes. In some instances, the layers are deposited on a substrate and then are subsequently removed, such as when the layer is used as a patterned masking material and then is subsequently removed after the pattern is transferred to an underlying layer. In other instances, the layers are deposited to perform a function in a device or system and remain as part of the fabricated device. There are numerous methods for depositing a thin film layer or a coating, such as: Sputter deposition, where a plasma is used to sputter atoms from a target material (commonly a metal), and the sputtered atoms deposit on the substrate. Chemical vapor deposition, where activated (e.g. by means of plasma, radiation, or temperature, or a combination thereof) species react either in a vapor phase (with subsequent deposition of the reacted product on the substrate) or react on the substrate surface to produce a reacted product on the substrate. Evaporative deposition, where evaporated material condenses on a substrate to form a layer. And, spin-on, spray-on, or dip-on deposition, typically from a solvent solution of the coating material, where the solvent is subsequently evaporated to leave the coating material on the substrate.

In applications where the wear on the coating is likely to occur due to mechanical contact or fluid flow over the substrate surface on which the layer of coating is present, it is helpful to have the coating chemically bonded directly to the substrate surface via reaction of the species with the surface in order to obtain particular surface properties.

With respect to layers and coatings which are chemically bonded to the substrate surface, areas of particular current interest are those of integrated circuitry, and a combination of integrated circuitry with mechanical systems, which are referred to as micro-electromechanical systems, or MEMS. Due to the nanometer size scale of some of the electrical devices formed, and the use of MEMS in applications such as the biological sciences, where the type and properties of the coating on the substrate surface is used to provide a particular functionality to the surface, a need has grown for improved methods of controlling the formation of the coating or layer on the substrate surface. Historically, these types of coatings were deposited in the liquid phase, resulting in limited film property control and loss of device yield due to capillary forces. More recently, vapor-phase deposition has been used as a way to replace liquid processing and to improve coating properties.

For purposes of illustrating a few of the many potential applications for vapor phase coatings, which must either be deposited to have particular critical properties and/or to have particular permanent structural orientation relative to the underlying substrate, applicants would like to mention the following publications and patents which relate to methods of coating formation. Applicants would like to make it clear that some of this Background Art is not prior art to the present invention because it has been published at such a time that it is subsequent to the date of invention for applicants' invention. It is mentioned here because it is of interest to the general subject matter.

Product applications employing coatings deposited on a substrate surface from a vapor include the following, as examples and not by way of limitation. U.S. Pat. No. 5,576,247 to Yano et al., issued Nov. 19, 1996, entitled: "Thin layer forming method where hydrophobic molecular layers preventing a BPSG layer from absorbing moisture". U.S. Pat. No. 5,602,671 of Hornbeck, issued Feb. 11, 1997, which describes low surface energy passivation layers for use in micromechanical devices. In particular, an oriented monolayer is used to limit the Van der Waals forces between two elements, reducing the attraction between the surfaces of the elements. An article by Steven A. Henck in Tribology Letters 3 (1997) 239-247, entitled "Lubrication of digital micromirror devices", describes nearly fifty lubricants which were investigated for use in a digital micromirror device. The lubricants included self-assembled monolayers (SAMs), fluids, and solid lubricants. The lubricants were used to reduce the adhesion between contacting surfaces within a microelectromechanical system (MEMS) device. In an article entitled "Vapor phase deposition of uniform and ultrathin silanes", by Yuchun Wang et al., SPIE Vol. 3258-0277-786X(98) 20-28, the authors describe uniform, conformal, and ultrathin coatings needed on the surface of biomedical microdevices such as microfabricated silicon filters, in order to regulate hydrophilicity and minimize unspecific protein adsorption. Jian Wang et al., in an article published in Thin Solid Films 327-329 (1998) 591-594, entitled: "Gold nanoparticulate film bound to silicon surface with self-assembled monolayers, discuss a method for attaching gold nanoparticles to silicon surfaces with a SAM used for surface preparation".

Patrick W. Hoffmann et al., in an article published by the American Chemical Society, Langmuir 1997, 13, 1877-1880, describe the molecular orientation in monomolecular thin organic films and surface coverage on Ge/Si oxide. A gas phase reactor was said to have been used to provide precise control of surface hydration and reaction temperatures during the deposition of monofunctional perfluorated alkylsilanes. Although some process conditions are provided, there is no description of the apparatus which was used to apply the thin films. T. M. Mayer et al. describe a "Chemical vapor deposition of fluoroalkylsilane monolayer films for adhesion control in microelectromechanical systems" in J. Vac. Sci. Technol. B 18(5), September/October 2000. This article mentions the use of a remotely generated microwave plasma for cleaning a silicon oxide substrate surface prior to film deposition, where the plasma source gas is either water vapor or oxygen. U.S. Pat. No. 6,203,505 to Jalisi et al., issued Mar. 20, 2001 describes guide wires having a vapor deposited primer coating. The guide wires are an intraluminal device having an adhesive primer coat formed of a carbonaceous material and a lubricious top coat of a hydrophilic polymeric material. One preferred coating method for applying a carbon-based primer coating is chemical vapor deposition. The coating is a plasma polymerized coating, so that the resulting polymer is an amorphous structure having groups in the structure other than the monomer groups of the source materials. For example, plasma polymerized polyethylene may include a variety of functional groups, such a vinyl, in addition to the methylene groups. In their article entitled: "Amino-terminated self-assembled monolayer on a SIO2 surface formed by chemical vapor deposition", J. Vac. Sci. Technol. A 19(4), July/August 2001, Atsushi Hozumi et al. describe the formation of self-assembled monolayers (SAMs) on n-type Si (100) wafers which were photochemically cleaned by a UV/ozone treatment, whereby a thin $SiO_2$ layer was formed on the silicon surface. The SAM coating was applied by placing a cleaned wafer together with a silane liquid precursor diluted with absolute toluene into a container having a dry nitrogen ambient atmosphere. The container was sealed with a cap and heated in an oven maintained at 373° K.

International Patent Application No. PCT/US01/26691, published on Apr. 11, 2002, describes substrates having a hydrophobic surface coating comprised of the reaction products of a chlorosilyl group compound and an alkylsilane. In a preferred embodiment, a hydrophobic coating is formed by the simultaneous aqueous vapor phase deposition of a chloroalkylsilane and a chlorosilyl group containing compound to form an anchor layer, which may then be capped with a hydrophobic coating. The reactants are said to be vapor-deposited simultaneously in a closed humidity-controlled chamber. Dry air, humid air, or dry air saturated with coating precursor vapor was introduced at one end of the chamber and exhausted at the other. The reaction precursors are said to be introduced into the reaction chamber by flowing dry air over the precursor liquid and into the chamber. U.S. Pat. No. 6,383,642 to Le Bellac et al., issued May 7, 2002 described formation of a hydrophobic/oleophobic coating on a substrate such as a glass or plastic material. The coating precursor is introduced into a chamber which employs a pulsed plasma, with the frequency of the plasma generation source ranging from 10 kHz to 10 GHz at a power from 100 to 2000 W, where the substrate surface area to be coated is 0.4 $M^2$. The precursors are introduced into the chamber at various flow rates to establish and maintain a pressure in the chamber ranging from 0.1 to 70 Pa.

W. Robert Ashurst et al., discuss a method of applying anti-stiction coatings for MEMS from a vapor phase in an article published by Elsevier Science B.V., in Sensors and Actuators A 104 (2003) 213-221. In particular, silicon (100) samples cut from a P-doped, n-type test wafer are rinsed in acetone and then cleaned by exposure to UV light and ozone for 15 minutes. The samples are treated with concentrated HF for 10 minutes and then cleaned again as described above before introduction to a vapor deposition chamber. In the vapor deposition chamber, the silicon substrates are additionally cleaned of any organic contamination using an oxygen plasma which is generated in the coating chamber, but at a sufficient distance away from the samples that the samples can be contacted by plasma species without being inside the plasma discharge area. After $O_2$ plasma exposure was begun, water gas was dosed into the chamber and eventually displaced the oxygen. The water was added to form —OH surface terminations on the substrate surface. The coating was applied by first admitting water vapor to the chamber until the pressure in the chamber exceeded 5 Torr. Subsequently, the chamber was evacuated down to the desired water vapor pressure between 1 and 1.3 Torr. Next a dimethyldichlorosilane (DDMS) precursor was introduced into the process chamber until the total pressure was in the range of 2.5-3 Torr. The reaction was carried out for 10-15 minutes, after which time the chamber was pumped out and vented with nitrogen. It was concluded that increasing substrate temperature during coating over a range of 20° C. to 50° C., all other variables being equal, results in films that have decreasing water contact angle. The main result of the temperature experiments is said to be that there is no need to heat the sample. In a second article entitled: "Vapor Deposition of Amino-Functionalized Self-Assembled Monolayers on Mems", Reliability, Testing, and Characterization of MEMS MOEMS II", Rajeshuni Ramesham, Danelle M. Tanner, Editors, Proceedings of SPIE Vol. 4980 (2003), authors Matthew G. Hankins et al. describe microengine test devices coated with films made from amino-functionalized silanes. The coatings were applied in a vapor-deposited self-assembled monolayer system developed at Sandia National Laboratories. The process variables used to deposit the coatings are not discussed in the article.

U.S. Pat. No. 6,576,489 to Leung et al., issued Jun. 10, 2003 describes methods of forming microstructure devices. The methods include the use of vapor-phase alkylsilane-containing molecules to form a coating over a substrate surface. The alkylsilane-containing molecules are introduced into a reaction chamber containing the substrate by bubbling an anhydrous, inert gas through a liquid source of the alkylsilane-containing molecules, to transport the molecules in the vapor phase into the reaction chamber. The formation of the coating is carried out on a substrate surface at a temperature ranging between about 15° C. and 100° C., at a pressure in the reaction chamber which is said to be below atmospheric pressure, and yet sufficiently high for a suitable amount of alkylsilane-containing molecules to be present for expeditious formation of the coating. The liquid source of alkylsilane molecules may be heated to increase the vapor pressure of the alkylsilane-containing molecules.

While various methods useful in applying layers and coatings to semiconductor devices and MEMS have been discussed above and there is some description of the kinds of apparatus which may be employed to deposit the coatings, the apparatus description is minimal. The following references deal more with apparatus. U.S. Patent Application Publication No. US 2001/0028924 A1 of Arthur Sherman, published Oct. 11, 2001, pertains to a method of sequential chemical vapor deposition which is used to deposit layers of inorganic materials such as $SiO_x$, $Al_2O_3$, $TiO_2$, $Si_3N_4$, $SiO_xN_y$, and aluminum films doped with copper and silicon. U.S. Patent Application Publication No. US 2002/0076507 A1 of Chiang et al., published Jun. 20, 2002, describes an atomic layer deposition (ALD) process based on the sequential supply of at least two separate reactants into a process chamber. A first reactant reacts (becomes adsorbed) with the surface of the substrate via chemisorption. The first reactant gas is removed from the process chamber, and a second reactant gas reacts with the adsorbed reactant to form a monolayer of the desired film. The process is repeated to form a layer of a desired thickness. To reduce the process time, there is no separate purge gas used to purge the first reactant gas from the chamber prior to introducing the second gas, containing the second reactant. Instead, the purge gas also includes the second reactant. Several valving systems for gas flow to provide various mixtures of gases are described in detail.

The background information above provides a number of methods for generation of coatings which have considerable commercial applicability. The apparatus described for producing layers or coatings for use in electronic devices and/or micro-electromechanical systems devices enables application of the layers or coatings, but does not provide sufficient accuracy and repeatability in terms of the amount of the vaporous reactants provided to the substrate surface. As a result, the precise composition of the layer or coating which is desired may not be available. At other times, because of the improper ratio of various reactants relative to each other, or oversaturation by a precursor, reactants may polymerize and/or particulate agglomerations may be formed which act as surface contaminants. Further, the ability to reproduce the same coating reliably, time after time, is diminished due to lack of control over the precise amount of reactants supplied to the coating formation process. This decreases the product yield and affects the commercial viability of a coating process. It would be highly desirable to have a more accurate and reliable method of supplying precise quantities of the reactants to the process chamber and to the substrate surface for coating formation.

SUMMARY OF THE INVENTION

We have developed an improved vapor-phase deposition method and apparatus for the application of layers and coatings on substrates. The method and apparatus are useful in the fabrication of electronic devices, micro-electromechanical systems (MEMS), Bio-MEMS devices, and microfluidic devices. The coating formation method employs a batch-like addition and mixing of all of the reactants to be consumed in a coating formation process. The coating formation process may be complete after one step, or may include a number of individual steps, where different or repetitive reactive processes are carried out in each individual step. The apparatus used to carry out the method provides for the addition of a precise amount of each of the reactants to be consumed in a single reaction step of the coating formation process. The apparatus may provide for precise addition of quantities of different combinations of reactants during a single step or when there are a number of different individual steps in the coating formation process. The precise addition of each of the reactants is based on a metering system where the amount of reactant added in an individual step is carefully controlled. In particular, the reactant in vapor form is metered into a vapor reservoir with a predetermined set volume at a specified temperature to a specified pressure to provide a highly accurate amount of reactant. The entire measured amounts(s) of each reactant is (are) transferred in batch fashion into the process chamber in which the coating is formed. The order in which each reactant is added to the chamber for a given reaction step is selectable, and may depend on the relative reactivities of the reactants when there are more than one reactant, the need to have one reactant or the catalytic agent contact the substrate surface first, or a balancing of these considerations.

In some instances, it may be necessary to carry out a series of individual vapor delivery steps to provide a complete coating, rather than carrying out one continuous reaction process. For example, all of a precisely measured quantity of one reacting component may be added initially, followed by a series of precisely measured quantities of a second reacting component. In each case all of the measured quantity is added to the reaction chamber. This provides a precise, carefully measured quantity of reactant at a precise time for each reactant.

A computer driven process control system may be used to provide for a series of additions of reactants to the process chamber in which the layer or coating is being formed. This process control system typically also controls other process variables, such as, (for example and not by way of limitation), process time, chamber pressure, temperatures of the process chamber and the substrate to which the coating is applied, as well as temperatures of the vapor delivery lines and vapor reservoirs relative to the temperatures of the precursors.

The apparatus for vapor deposition of coatings is particularly useful for deposition of coatings having a thickness ranging from about 5 A to about 1,000 A, (and may be used for increased coating thicknesses), where at least one precursor used for formation of the coating exhibits a vapor pressure below about 150 Torr at a temperature of 25° C. The apparatus includes at least one precursor container in which at least one precursor, in the form of a liquid or solid, is placed; at least one precursor vapor reservoir for holding vapor of the at least one precursor; at least one device which controls precursor vapor flow from the precursor container into the precursor vapor reservoir; a pressure sensor in communication with the precursor vapor reservoir; a process controller which receives data from the pressure sensor, compares the data with a desired nominal vapor reservoir pressure, and sends a signal to a device which controls vapor flow from the precursor container into the precursor vapor reservoir, to prevent further vapor flow into the precursor vapor reservoir when the desired nominal pressure is reached; a device which controls precursor vapor flow into the precursor vapor reservoir upon receipt of a signal from the process controller; a process chamber for vapor deposition of the coating on a substrate present in the process chamber; and a device which controls precursor vapor flow into the process chamber upon receipt of a signal from the process controller.

In some instances, the apparatus includes a device which applies heat to the precursor while it is in the container, to produce a vaporous phase of the precursor. Typically the apparatus includes at least one catalyst container, in which a catalyst, in the form of a liquid or a solid is placed; and a catalyst vapor reservoir for holding vapor of the catalyst, with the same basic elements facilitating transfer of catalyst to the process chamber at those described with reference to a precursor.

A method of the invention provides for vapor-phase deposition of coatings, where at least one precursor used for formation of the coating exhibits a vapor pressure below about 150 Torr at a temperature of 25° C. The method includes the steps of: a) providing a processing chamber in which the coating is vapor deposited; b) providing at least one precursor exhibiting a vapor pressure below about 150 Torr at a temperature of 25° C.; c) transferring vapor of the precursor to a precursor vapor reservoir in which the precursor vapor accumulates; d) accumulating a nominal amount of the precursor vapor required for the vapor phase coating deposition; and e) adding the nominal amount of the precursor vapor to the processing chamber in which the coating is being deposited. Typically at least one catalyst vapor is added to the process chamber in addition to the at least one precursor vapor, where the relative quantities of catalyst and precursor vapors are based on the physical characteristics to be exhibited by the coating.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

We have developed an improved vapor-phase deposition method and apparatus for application of a thin (typically 5 A to 1,000 A thick, in and in some instances up to about 2,000 A thick) film or coating to a semiconductor device substrate or a micro-electromechanical systems device. The method and apparatus are employed when at least one of the reactants or a catalyst used in coating formation must be vaporized prior to use, and where the amount of each reactant must be carefully controlled in terms of quantity available to react, in terms of time available for reaction at a given process pressure, or a combination of both. The method is particularly useful in the deposition of thin films or coatings where the thickness of the film or coating ranges from about 5 A to about 500 A, and provides excellent results for coatings having a thickness in the range of about 300 A.

As previously discussed herein, there are a multitude of applications for such thin layers or coatings. For purposes of illustration, applicants will describe the method and apparatus of the present invention in terms of the tunable deposition of an organic monolayer; however, one skilled in the art of deposition of layers and coatings will be able to use the concepts described for coatings which are not organic, and/or not monolayers.

There is a particular interest at this time in anti-stiction layers and coatings which are needed to enable reliable, long-term performance of the micro-electromechanical systems. Stiction (adhesion) of compliant micromechanical parts is one of the key reliability issues that has proven difficult to overcome. Conventionally, solution-based antistiction monolayers have been used; however, more recently, due to capillary stiction, particulation problems, and unsatisfactory quality, scalability, and reproducibility of the films produced by relatively lengthy wet processing, efforts are underway to develop vapor deposition methods for the antistiction coatings. The vacuum processing and vapor phase deposition of antistiction coatings, including self-assembled monolayers (SAMs) has provided higher quality films in general. An integrated vapor deposition process (including surface plasma treatment in the same chamber) typically offers better control of surface reactivity, while avoiding the potential for stiction between micromechanical parts during application of the antistiction coating.

The embodiments described in the examples below are with reference to the application of organic SAM coatings which are applied using vapor deposition techniques over the surface of a single crystal silicon substrate. The apparatus used for deposition of the coatings is available from Applied Microstructures, Inc. of San Jose, Calif. This apparatus is specifically designed to provide a high degree of control in terms of quantity of reactants provided to the coating application processing chamber for each individual process step, and in terms of the time and order at which these reactants are made available for the reaction.

The properties of the deposited films were evaluated using standard surface analysis methods, cantilever-beam-array test structures, and performance analysis of working MEMS devices.

I. An Apparatus for Vapor Deposition of Thin Coatings

Figure 1:
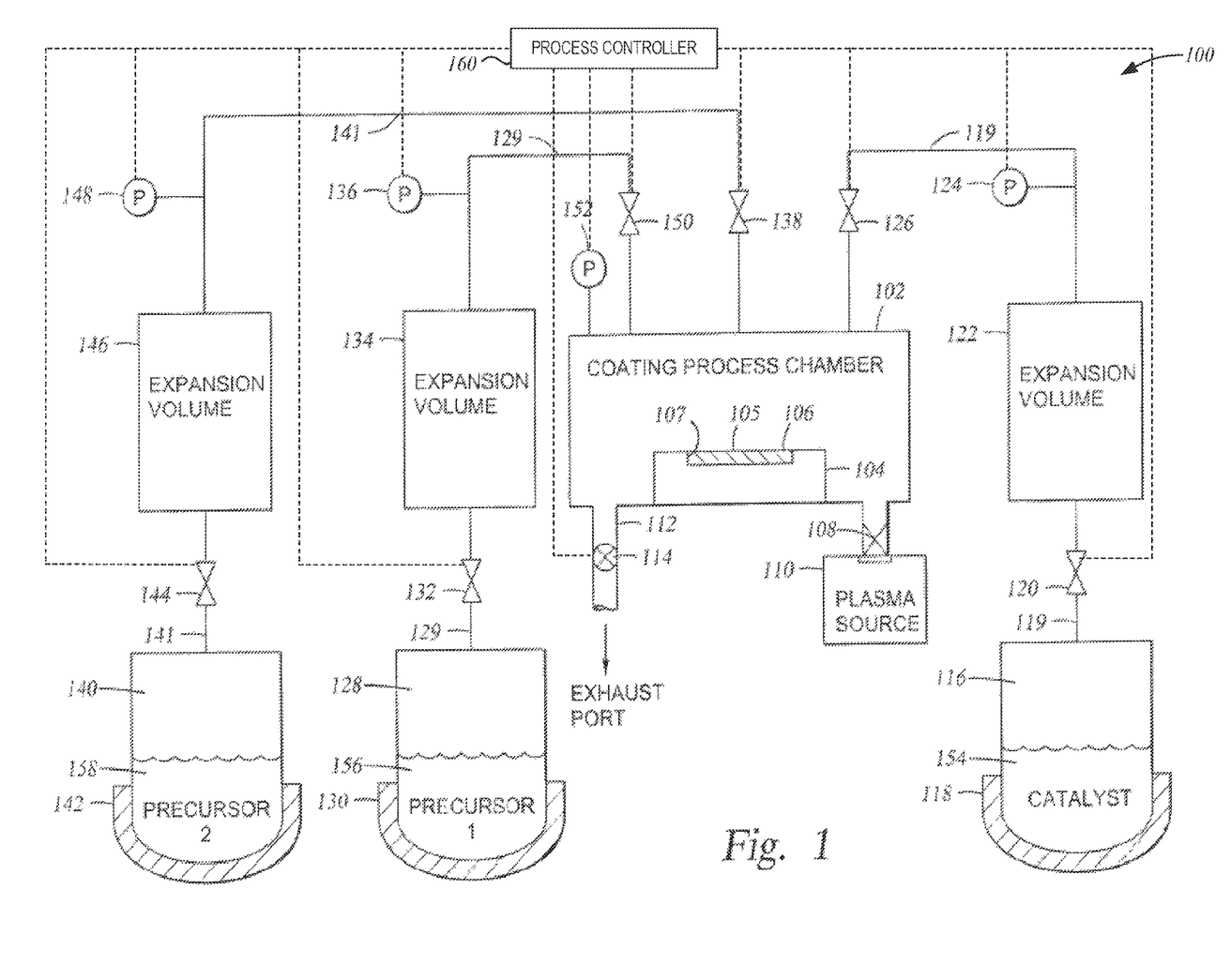
FIG. 1 shows a cross-sectional schematic of an apparatus 100 for vapor deposition of a coating, which apparatus employs the present invention for metering precise amounts of reactants to the coating formation process.

FIG. 1 shows a cross-sectional schematic of an apparatus 100 for vapor deposition of thin coatings. The apparatus 100 includes a process chamber 102 in which thin (typically 5 A to 1,000 A thick) coatings are vapor deposited. A substrate 106 to be coated rests upon a substrate holder 104, typically within a recess 107 in the substrate holder 104. Depending on the chamber design, the substrate 106 may rest on the chamber bottom (not shown in this position in FIG. 1). Attached to process chamber 102 is a remote plasma source 110, connected via a valve 108. Remote plasma source 110 may be used to provide a plasma which is used to clean and/or convert a substrate surface to a particular chemical state prior to application of a coating (which enables reaction of coating species and/or catalyst with the surface, thus improving adhesion and/or formation of the coating); or may be used to provide species helpful during formation of the coating (not shown) or modifications of the coating after deposition. The plasma may be generated using a microwave, DC, or inductive RF power source, or combinations thereof. The process chamber 102 makes use of an exhaust port 112 for the removal of reaction byproducts and is opened for pumping/purging the chamber 102. A shut-off valve or a control valve 114 is used to isolate the chamber or to control the amount of vacuum applied to the exhaust port. The vacuum source is not shown in FIG. 1.

The apparatus 100 shown in FIG. 1 is illustrative of a vapor deposited coating which employs two precursor materials and a catalyst. One skilled in the art will understand that one or more precursors and from zero to multiple catalysts may be used during vapor deposition of a coating. A catalyst storage container 116 contains catalyst 154, which may be heated using heater 118 to provide a vapor, as necessary. It is understood that precursor and catalyst storage container walls, and transfer lines into process chamber 102 will be heated as necessary to maintain a precursor or catalyst in a vaporous state, minimizing or avoiding condensation. The same is true with respect to heating of the interior surfaces of process chamber 102 and the surface of substrate 106 to which the coating (not shown) is applied. A control valve 120 is present on transfer line 119 between catalyst storage container 116 and catalyst vapor reservoir 122, where the catalyst vapor is permitted to accumulate until a nominal, specified pressure is measured at pressure indicator 124. Control valve 120 is in a normally-closed position and returns to that position once the specified pressure is reached in catalyst vapor reservoir 122. At the time the catalyst vapor in vapor reservoir 122 is to be released, valve 126 on transfer line 119 is opened to permit entrance of the catalyst present in vapor reservoir 122 into process chamber 102 which is at a lower pressure. Control valves 120 and 126 are controlled by a process controller 160, which may be a programmable process control system of the kind known in the art.

A Precursor 1 storage container 128 contains coating reactant Precursor 1, which may be heated using heater 130 to provide a vapor, as necessary. As previously mentioned, Precursor 1 transfer line 129 and vapor reservoir 134 internal surfaces are heated as necessary to maintain a Precursor 1 in a vaporous state, avoiding condensation. A control valve 132 is present on transfer line 129 between Precursor 1 storage container 128 and Precursor 1 vapor reservoir 134, where the Precursor 1 vapor is permitted to accumulate until a nominal, specified pressure is measured at pressure indicator 136. Control valve 132 is in a normally-closed position and returns to that position once the specified pressure is reached in Precursor 1 vapor reservoir 134. At the time the Precursor 1 vapor in vapor reservoir 134 is to be released, valve 138 on transfer line 129 is opened to permit entrance of the Precursor 1 vapor present in vapor reservoir 134 into process chamber 102, which is at a lower pressure. Control valves 132 and 138 are controlled by a process controller 160, which may be a programmable process control system of the kind known in the art.

A Precursor 2 storage container 140 contains coating reactant Precursor 2, which may be heated using heater 142 to provide a vapor, as necessary. As previously mentioned, Precursor 2 transfer line 141 and vapor reservoir 146 internal surfaces are heated as necessary to maintain Precursor 2 in a vaporous state, avoiding condensation. A control valve 144 is present on transfer line 141 between Precursor 2 storage container 146 and Precursor 2 vapor reservoir 146, where the Precursor 2 vapor is permitted to accumulate until a nominal, specified pressure is measured at pressure indicator 148. Control valve 144 is in a normally-closed position and returns to that position once the specified pressure is reached in Precursor 2 vapor reservoir 146. At the time the Precursor 2 vapor in vapor reservoir 146 is to be released, valve 150 on transfer line 141 is opened to permit entrance of the Precursor 2 vapor present in vapor reservoir 146 into process chamber 102, which is at a lower pressure. Control valves 144 and 150 are controlled by a process controller 160, which may be a programmable process control system of the kind known in the art.

During formation of a coating (not shown) on a surface 105 of substrate 106, at least one incremental addition of vapor equal to the vapor reservoir 122 of the catalyst 154, or the vapor reservoir 134 of the Precursor 1, or the vapor reservoir 146 of Precursor 2 may be added to process chamber 102. The total amount of vapor added is controlled by both the adjustable volume size of each of the expansion chambers (typically 50 cc up to 1,000 cc) and the number of vapor injections (doses) into the reaction chamber. Further, the process control system (not shown) may adjust the set pressure 124 for catalyst vapor reservoir 122, or the set pressure 136 for Precursor 1 vapor reservoir 134, or the set pressure 148 for Precursor 2 vapor reservoir 146, to adjust the amount of the catalyst or reactant added to any particular step during the coating formation process. This ability to fix precise amounts of catalyst and coating reactant precursors dosed (charged) to the process chamber 102 at any time during the coating formation enables the precise addition of quantities of precursors and catalyst at precise timing intervals, providing not only accurate dosing of reactants and catalysts, but repeatability in terms of time of addition.

This apparatus provides a very inexpensive, yet accurate method of adding vapor phase precursor reactants and catalyst to the coating formation process, despite the fact that many of the precursors and catalysts are typically relatively non-volatile materials. In the past, flow controllers were used to control the addition of various reactants; however, these flow controllers may not be able to handle some of the precursors used for vapor deposition of coatings, due to the low vapor pressure and chemical nature of the precursor materials. The rate at which vapor is generated from some of the precursors is generally too slow to function with a flow controller in a manner which provides availability of material in a timely manner for the vapor deposition process.

The present apparatus allows for accumulation of the vapor into an adequate quantity which can be charged (dosed) to the reaction. In the event it is desired to make several doses during the progress of the coating deposition, the apparatus can be programmed to do so, as described above. Additionally, adding of the reactant vapors into the reaction chamber in controlled aliquots (as opposed to continuous flow) greatly reduces the amount of the reactants used and the cost of the coating process.

Figure 2:
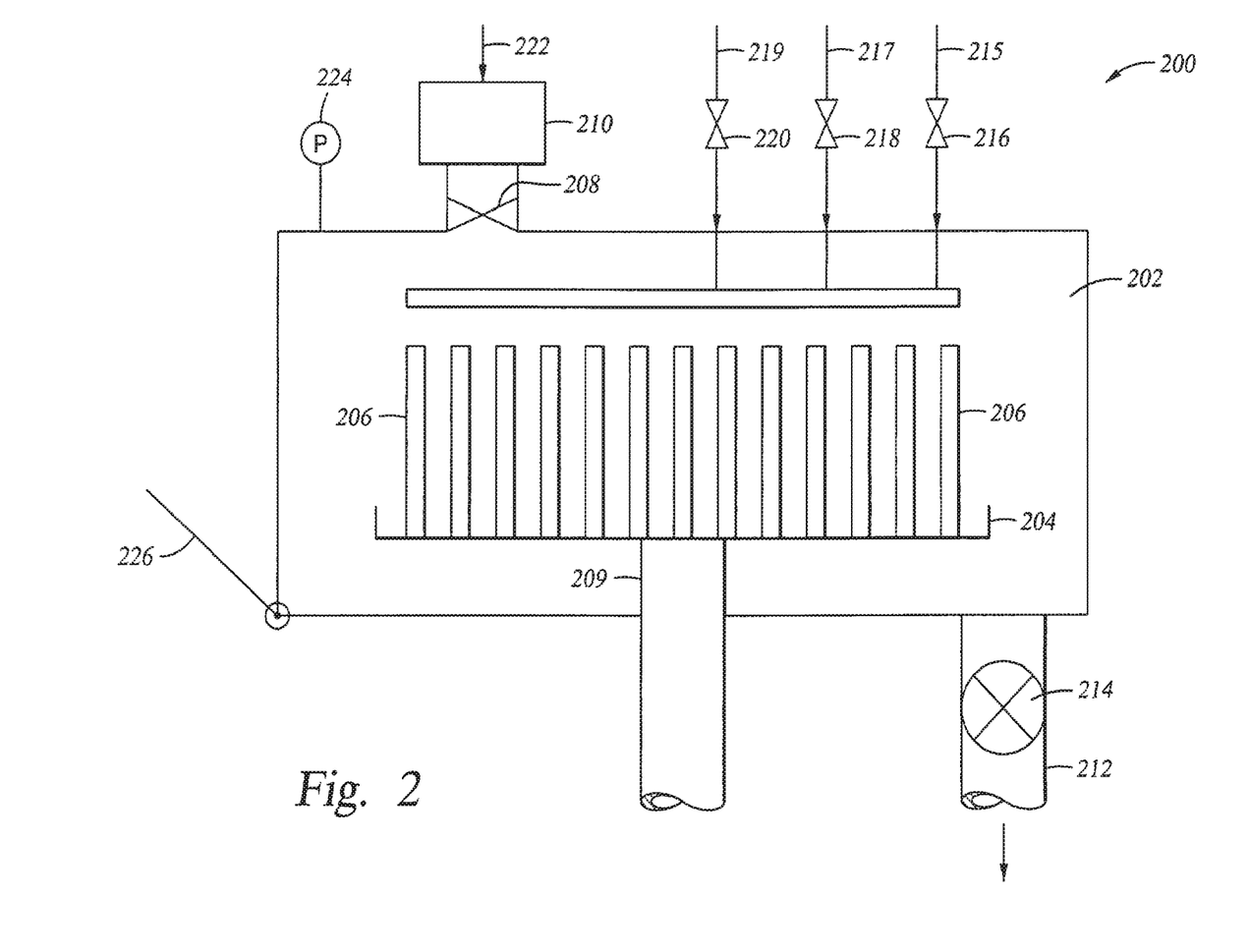
FIG. 2 shows a cross-sectional schematic view of an apparatus 200 of the kind shown in FIG. 1, where a number of substrates are processed simultaneously.

FIG. 2 shows a cross-sectional schematic of an embodiment of a vapor deposition processing apparatus 200 which provides for the application of a thin coating to a plurality of substrates 206 simultaneously. The apparatus 200 includes a process chamber 202 in which thin (5 A to 1,000 A thick) coatings are vapor deposited. A plurality of substrates 206 to be coated rest upon a substrate holder 204, which can be moved within process chamber 202 using a device 209. Attached to process chamber 202 is a remote plasma source 210, connected via a valve 208. Remote plasma source 210 may be used to provide a plasma which is used to clean or to react with (activate) a substrate surface prior to application of a coating or may be used to provide species helpful during or after formation of the coating (not shown). As previously described, the plasma may be generated using a microwave, DC, or inductive RF power source, or may be generated using a combination of power sources. The process chamber 202 makes use of an exhaust port 212 for the removal of reaction byproducts and for pumping/purging of the process chamber 202. A control valve 214 is used to control the speed of vacuum pumping and evacuation (vacuum generator not shown).

The apparatus 200 shown in FIG. 2 is illustrative of a vapor deposited coating which employs two precursor materials and a catalyst. One skilled in the art will understand that one or more precursors and from zero to multiple catalysts may be used during vapor deposition of a coating. Catalyst for use during the coating deposition process enters process chamber 202 from a catalyst vapor reservoir (not shown) through line 219 through control valve 220. Precursor 1 for use during the coating deposition process enters process chamber 202 from a Precursor 1 vapor reservoir (not shown) through line 217 through control valve 218, and Precursor 2 enters process chamber 202 from a Precursor 2 vapor reservoir (not shown) through line 215 through control valve 216. As previously mentioned transfer lines for the Catalyst, Precursor 1, and Precursor 2 are heated as necessary to maintain these materials in a vaporous state, avoiding condensation. The Catalyst, Precursor 1 and Precursor 2 may be distributed within process chamber 202 through a baffling system 205 which typically contains separate distribution paths for the catalyst and each precursor used in the coating deposition process. The baffling system helps ensure even distribution of each reaction component material throughout process chamber 202. Process chamber 202 typically uses a swing door or a load lock 226. Upon completion of the reaction, process byproducts exit process chamber 202 through exhaust port 212, which is connected to a vacuum pump (not shown). The interior surfaces of process chamber 200 and other apparatus such as baffling system 205 are typically heated to prevent condensation of the Catalyst, Precursor 1, and Precursor 2 upon these apparatus surfaces. The reaction pressure is typically determined by the amount of reactants injected into chamber 202. The processing chamber pressure is monitored by pressure sensing device 224, which is coordinated with the vapor delivery system previously described through a computerized control system (not shown). A flow control valve 214 is used to remove vapor and byproducts in general from the interior of process chamber 202. The operation of flow control valve 214 may be coordinated, through the computerized control system, to function in combination with the pressure sensing device, to maintain the desired pressure during pumping/purging steps.

Figure 3:
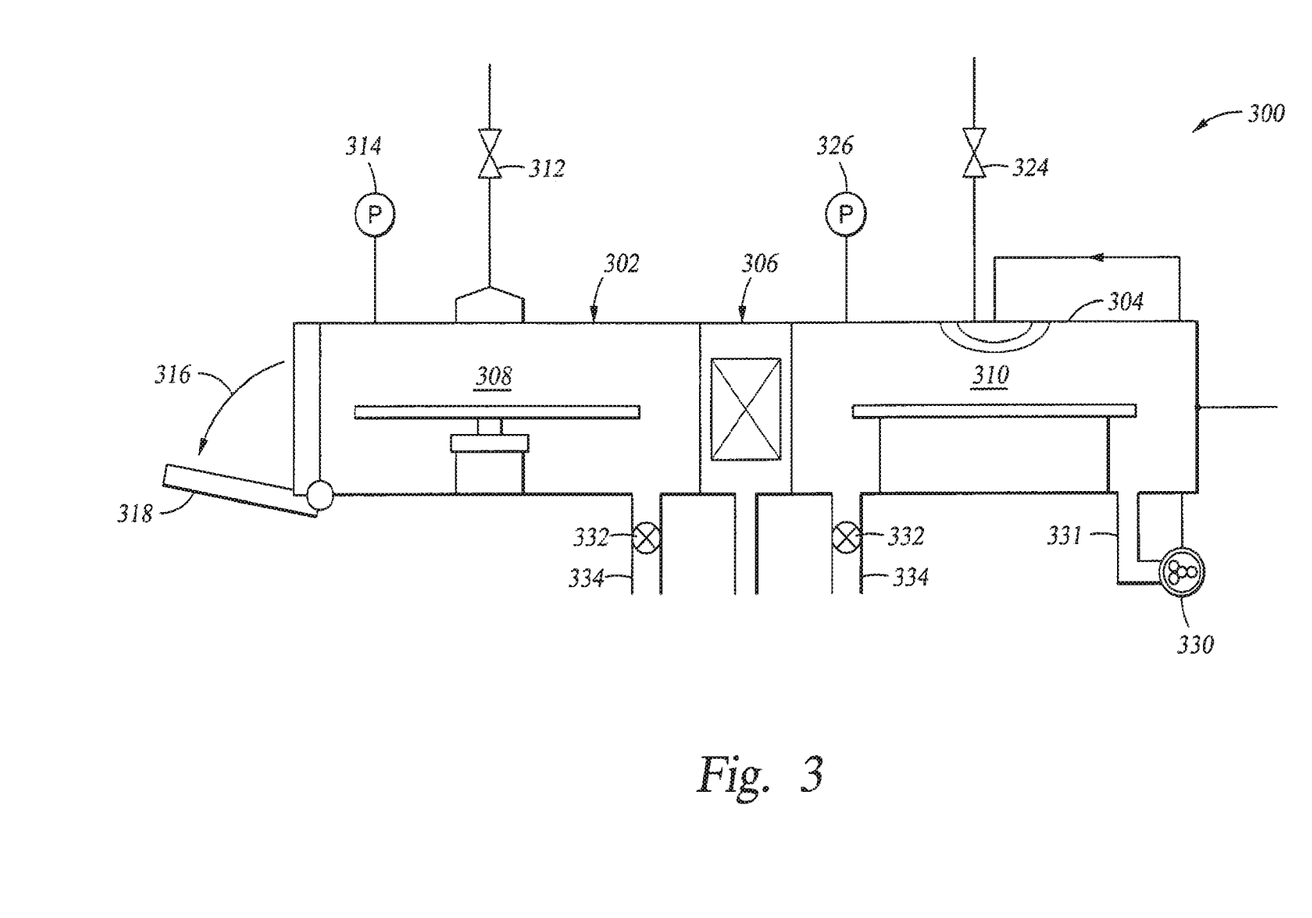
FIG. 3 is a schematic illustrating a system 300 of the kind which could be used for production of a MEMS device where there are moving parts which are formed by a release-etching process in system 304 and where, subsequent to the release-etch process, the MEMS device is transferred through a pressure controlled passageway 306 to a coatings application chamber 302 of the kind described with reference to FIG. 1.

FIG. 3 shows a cross-sectional schematic of a MEMS processing system 300 which employs a release-etch processing chamber 310 (of the type used to produce moveable elements of a mechanical nature in a MEMS device) and a vapor deposition coating application system 312 of the kind previously described with reference to FIGS. 1 and 2. The release-etch process chamber 310 includes apparatus for reagent entry 324 (shown as a single line for convenience, but which may be a plurality of lines); a pressure sensing and monitoring device 326; an exhaust port 334, with flow control valve 332; a recirculation loop 331 with pump 330 is optional, but can be used to provide important processing advantages. The vapor deposition coating apparatus process chamber 308 includes apparatus for reagent (catalyst and precursor) entry 312 (shown as a single line for convenience, but which is a plurality of lines as previously discussed); a pressure sensing and monitoring device 314; and an exhaust port 322, with a control valve 320. The release-etch process chamber 310 and vapor deposition coating process chamber 308 are joined to each other through an isolation valving system 306.

II. Exemplary Methods of the Invention

As discussed with respect to the apparatus, there have been problems in providing accurately measured quantities of reactants on a repeatable basis to a vapor deposition coating system. This is because many of the precursor materials for coating formation have a low vapor pressure or are not compatible with mass flow controllers. In addition, for many of the vapor deposition coatings, water acts as a catalyst to the coating formation, and the amount of water present in the coating deposition chamber is not precisely controlled.

When the surfaces of features to be coated are in the nanometer size range, it is critical that the coating deposition be carefully controlled to provide the desired thickness of coating (typically about 5 A to 1,000 A, and in some instances up to 2,000 A) over the entire surface area, and that there be no formation of particulate or agglomerations within the depositing coating. In order to meet these critical requirements for thin vapor deposited coatings, it is necessary to provide accurately measured quantities of reactants and catalysts and to control the time period over which these accurately measured quantities are delivered to the surface of the substrate or the deposition chamber. Delivery to the surface of the substrate depends on interior design of the processing chamber, and there are techniques which are well known in the art of chemical vapor deposition which apply to delivery of reagents to the substrate surface. The present method addresses the problem of providing accurately measured quantities of reactants and catalysts which are delivered in the proper order and at the proper time to the coating deposition chamber.

By way of example and not by way of limitation, the provision of accurate quantities of reactants and catalysts will be illustrated with respect to monolayer coatings of chloro-silanes and alkyl-silanes which are used in many applications such as MEMS, BioMEMS, and micro-fluidics. Organic precursor materials such as (and not by way of limitation) silanes, chlorosilanes, fluorosilanes, methoxy silanes, alkyl silanes, and amino silanes are useful in general. Some of the particular precursors used to produce coatings are, by way of example and not by way of limitation, perfluorodecyltrichlorosilanes (FDTS), undecenyl-trichlorosilanes (UTS), vinyl-trichlorosilanes (VTS), decyl-trichlorosilanes (DTS), octadecyltrichlorosilanes (OTS), dimethyldichlorosilanes (DDMS), dodecenyltricholrosi-lanes (DDTS), fluoro-tetrahydrooctyldimethylchlorosilanes (FOTS), perfluorooctyldimethylchlorosilanes, aminopropy-lmethoxysilanes (APTMS), fluoropropylmethyldichlorosi-lanes, and perfluorodecyldimethylchlorosilanes. The OTS, DTS, UTS, VTS, DDTS, FOTS, and FDTS are all trichloro silane precursors. The other end of the precursor chain is a saturated hydrocarbon with respect to OTS, DTS, and UTS; contains a vinyl functional group, with respect to VTS and DDTS; and contains fluorine atoms with respect to FDTS (which also has fluorine atoms along the majority of the chain length). Other useful precursors include 3-aminopro-pyltrimethoxysilane (APTMS), which provides amino functionality, and 3-glycidoxypropyltrimethoxysilane (GPTMS). One skilled in the art of organic chemistry can see that the vapor deposited coatings from these precursors can be tailored to provide particular functional characteristics for a coated surface. The surface to be coated may be silicon, glass, organic (plastic) or metal, for example.

Most of the silane-based precursors, such as commonly used di- and tri-chlorosilanes, for example and not by way of limitation, tend to create agglomerates on the surface of the substrate during the coating formation. These agglomerates can cause structure malfunctioning or stiction. Such agglomerations are produced by partial hydrolysis and poly-condensation of the polychlorosilanes. This agglomeration can be prevented by precise metering of moisture in the process ambient which is a source of the hydrolysis, and by carefully controlled metering of the availability of the chlorosilane precursors to the coating formation process.

Those working in the MEMS field have recognized the advantages of vapor deposited coatings over coatings applied using liquid-based immersion, spray-on and spin-on techniques. Some of those advantages include: elimination of stiction induced by capillary forces; control of the coating environment (particularly the amount of moisture present); uniform coating properties on micron and nanometer size patterns such as microchannels and pores; solvent free process with no contamination; and, a faster process which is compatible with MEMS clean room processing protocols, for example.

In a vapor deposition process which employs one precursor and a catalyst, a DDTS precursor may be used in combination with a water catalyst, for example. In a vapor deposition process which employs two precursors and a catalyst, a DDTS precursor, a UTS precursor, and a water catalyst may be used in combination, for example and not by way of limitation. The relative quantities of the DDTS and UTS precursors can be adjusted to provide different overall functional properties for the coated surface. However, the ability to control the coated surface properties and to reliably reproduce the properties depends on the ability to control the relative quantities of the DDTS and UTS precursors supplied to the coating formation process. This ability depends on provision of accurately controlled quantities of the kind which are possible when the present method of invention is used.

When the precursors used to form the initial vapor deposited coating have potentially reactive functional groups on the exposed surface of the coating, the functional groups can be further reacted with other chemical compounds to modify the functionality of the surface of the coating.

In addition to organo-silanes, poly(ethylene glycol) (PEG) is used separately or in combination with other film-forming compounds such as the silanes to provide biotechnology functional surfaces. One portion of the coated surface may be coated with the reaction product of an organo-silane, while another is coated with a PEG reaction product. In the alternative, the organo-silane may include a functional group on the distal end of the polymer chain, away from the substrate surface, which functional group can be reacted with a PEG reactant, to place a PEG functional group at the distal end of the polymer chain, affecting coating surface functionality. For example, PEG films are known to reduce protein adsorption in micro-fluidic applications. PEG 3 films include 6 carbons, while PEG 2 films include 4 carbons. The length of the polymer chain can also be adjusted to provide the desired film properties.

The present method for vapor deposition of coatings provides a number of advantages. Typically a remote plasma source is used to generate a cleaning plasma (typically oxygen-containing) which can be used to remove contaminants from the substrate surface. When the substrate is silicon, the cleaning process is useful in the formation of —OH functional groups which serve as binding sites for a number of coating precursors such as the trichloro silanes. Precise control of the amount of precursors is ensured through the direct measurement of the vapor pressure of the precursor at a given temperature in a known volume. Process control is provided by varying the partial pressure and the amount of the precursors employed in the vapor phase reaction.

III. General Parameter Descriptions for Vapor Deposition of a Molecular Coating Surfaces to be coated are typically pretreated in the same chamber. To obtain bonding of a chloro-functional group to a substrate surface, it is necessary to create OH-terminated sites on the surface. This can be done in the deposition chamber by treating a silicon surface with an oxygen plasma in the presence of moisture. The plasma may be produced using a remote power source of the kind previously described. The pressure in the processing chamber during exposure of a substrate to the oxygen plasma typically ranges from about 0.2 Torr to about 2 Torr, more typically from about 0.5 Torr to about 1 Torr. For a process chamber having a volume of about 2 liters, the plasma source gas oxygen flow rate ranges from about 50 sccm to about 300 sccm, more typically from about 100 sccm to 200 sccm. The substrate processing time is typically about 1 minute to about 10 minutes, and more typically from about 1 minute to about 5 minutes.

The coating deposition is typically carried out in the deposition chamber at a pressure ranging from about 100 mTorr to about 10 Torr, more typically at a pressure ranging from about 0.5 Torr to about 5 Torr, and most typically at a pressure ranging from about 0.1 Torr to about 3 Torr. The deposition temperature of the substrate depends on the particular coating precursors and on the substrate material. For a silicon substrate, where the coating precursor is FOTS or DDMS, used in combination with a water catalyst, the substrate temperature is typically in the range of about 20° C. to about 60° C. To maintain these coating precursors in a vaporous state prior to reaction, the interior surfaces of the coating deposition process chamber are typically maintained at a temperature ranging from about 30° C. to about 60° C. The time period required to produce a continuous monolayer coating over the entire surface of the silicon substrate using these coating precursors and the specified reaction temperature ranges from about 1 minute to about several hours, depending on precursor chemistry and substrate material, typically the reaction time period is in the range of 5 minutes to 30 minutes, where the coating precursor is FOTS or DDMS.

For deposition of an antistiction MEMS coating from chlorosilane precursors, the following recipe and process conditions were used. In each case, a single precursor, selected from the group consisting of dimethyldichlorosilane (DDMS), tridecafluoro-1,1,2,2-tetrahydrooctyltrichlorosilane (FOTS), and heptadecafluoro-1,1,2,2-tetrahydrodecyltrichlorosilane (FDTS), was vaporized and used in combination with water vapor as a catalyst. In each instance, the precursor and the water were degassed under vacuum to remove dissolved gases prior to introduction into the system. The conditions for degassing vary, depending on the precursor and catalyst, but one skilled in the art can easily determine proper degassing conditions.

With reference to FIG. 1, the degassed water was placed in catalyst storage container 116 and was heated to a temperature of about 30° C. to produce a vapor which was passed through transfer line 119 to accumulate in vapor reservoir 122, which had a volume of 300 cc, and which was held at a pressure of 16 Torr. A DDMS precursor was placed in Precursor 1 storage container 128 and was heated to a temperature of 30° C. to produce a vapor which was passed through transfer line 129 to accumulate in vapor reservoir 134, which had a volume of 50 cc, and which was held at a pressure of 50 Torr. There was no precursor in Precursor 2 storage container 140.

A silicon substrate 106, having a surface 105 was manually loaded onto the substrate holder 104. The process chamber 102, having a volume of about 2 liters, was pumped down to about 20 mTorr and purged with nitrogen gas prior to and after the coating reaction, which consisted of oxygen plasma treatment followed by coating deposition. The process chamber 102 was vented to atmosphere. The process chamber 102 was then purged using nitrogen (filled with nitrogen to 10 Torr/pumped to 0.7 Torr, five times). The surface 105 was treated with a remotely generated oxygen plasma from plasma source 110 in the manner described above. Oxygen was directed into a plasma generation source 110 through a mass flow controller (not shown). The oxygen flow rate for plasma generation, based on the desired plasma residence time for process chamber 102, was about 200 sccm. The pressure in process chamber 102 was about 0.6 Torr. The surface 105 of silicon substrate 106 was treated with the oxygen plasma at a pressure of about 0.6 Torr for a time period of about 5 minutes. The plasma treatment was discontinued, and the process chamber 102 was pumped down to the base pressure of about 30 mTorr.

The water vapor reservoir 122 was charged with water vapor to a pressure of 16 Torr, as described above. The valve 126 between water vapor reservoir 122 and process chamber 102 was opened until both pressures equalized (a time period of about 5 seconds) to about 0.8 Torr. The water vapor reservoir 122 was charged with vapor to 16 Torr a second time, and this volume of vapor was also dumped into the process chamber, bringing the total water vapor pressure in process chamber 102 to about 1.6 Torr. The DDMS vapor reservoir 134 had been charged with the precursor vapor to 50 Torr, as described above, and the DDMS vapor was added immediately after completion of the water vapor addition. The valve 138 between the DDMS vapor reservoir 134 and process chamber 102 was opened until both pressures were equalized (a time period of about 5 seconds) to about 4 Torr. The water and DDMS vapors were maintained in process chamber 102 for a time period of 15 minutes. The process chamber was then pumped back to the base pressure of about 30 mTorr.

The process chamber 102 was then purged (filled with nitrogen to 10 Torr/pumped to 0.7 Torr) five times. The process chamber was then vented to atmosphere, and the silicon substrate 106 was manually removed from the process chamber.

The resulting coated surface is typically very hydrophobic, as measured by water contact angle, which is typically about 103° for DDMS films. The surface was particularly smooth, having an RMS of 0.2 nm, with no visible particulation or defects. The measured work of adhesion was reduced up to 3,000 times depending on the specific process/chemistry. Under the conditions provided above, the measured work of adhesion was reduced to about 30 $\mu J^{-2}$. The properties of the vapor deposited films are equivalent to or better than those reported for liquid-phase deposited films. In addition, use of vapor deposition prevents the stiction which frequently occurs during wet processing of the substrate.

The above described exemplary embodiments are not intended to limit the scope of the present invention, as one skilled in the art can, in view of the present disclosure expand such embodiments to correspond with the subject matter of the invention claimed below.

What is claimed is:

1. An apparatus for vapor deposition of thin film coatings, the apparatus comprising:
   a) a process controller;
   b) a plurality of precursor containers into which a plurality of coating precursors, each in the form of a liquid or a solid, are respectively placed;
   c) a plurality of precursor vapor reservoirs, each in communication with a respective one of said precursor containers;
   d) a plurality of in-line devices which control a vapor flow of a coating precursor vapor from one of said precursor containers into one of said precursor vapor reservoirs with which said precursor container is in communication upon receipt of a signal from said process controller;
   e) a plurality of precursor control valves which control vapor flow from said precursor vapor reservoir upon receipt of a signal from said process controller; and
   f) a process chamber for vapor deposition of said coating on a substrate when present in said process chamber, the process chamber being in direct communication with each of the plurality of precursor vapor reservoirs, the process chamber having a vacuum control valve to control an amount of vacuum applied to the process chamber by a vacuum source;
   wherein said process controller is programmed to provide for a single period of vapor flow or intermittent periods of vapor flow, each period of vapor flow defined by a dosage of a controlled aliquot of coating precursor vapor from one of said precursor vapor reservoirs into said process chamber without using a carrier gas, and to close the vacuum control valve to isolate the process chamber during each period of vapor flow and during a reaction time period in which at least two coating precursor vapors are maintained in the process chamber;
   wherein the process controller is programmed to, during periods of vapor flow of the at least two coating precursor vapors, maintain the closure of the vacuum control valve so that the at least two coating precursor vapors are simultaneously present in the process chamber and so that the total pressure of the process chamber results from equalization of the controlled aliquots that are added to the process chamber during the periods of vapor flow of the at least two coating precursor vapors.

2. An apparatus in accordance with claim 1, further comprising:
   g) a plurality of heating devices, wherein one of said heating devices applies heat to one of said precursor containers, to produce said coating precursor vapor within one of said precursor containers.

3. An apparatus in accordance with claim 1, further comprising:
   g) at least one catalyst delivery system, said catalyst delivery system including,
      1) at least one catalyst vapor reservoir in which a catalyst is present in a vaporous form; and,
      2) at least one in-line device which controls precursor vapor flow from said at least one catalyst vapor reservoir into said process chamber.

4. An apparatus in accordance with claim 1, further comprising:
   g) a remote plasma generator which furnishes plasma species to said process chamber.

5. An apparatus in accordance with claim 1, wherein the process chamber has a pressure of about 0.1 Torr to about 3 Torr during each period of vapor flow.

6. An apparatus in accordance with claim 1, wherein the process chamber has a temperature of about 20 degrees Celsius to about 60 degrees Celsius.

7. An apparatus in accordance with claim 1, wherein the process chamber has a pressure of about 0.1 Torr to about 5 Torr during the reaction time period.

8. An apparatus in accordance with claim 1, wherein the process chamber has a pressure of about 0.1 Torr to about 3 Torr during the reaction time period.

9. An apparatus in accordance with claim 1, wherein the reaction time period is between about 1 minute and about 30 minutes.

10. An apparatus in accordance with claim 1, wherein at least one of the coating precursors exhibits a vapor pressure below about 150 Torr at a temperature of 25 degrees Celsius.

11. An method for vapor deposition of thin film coatings, comprising:
    providing a plurality of coating precursors, each in the form of a liquid or a solid;

transferring coating precursor vapors generated from the coating precursors to a plurality of respective precursor vapor reservoirs, so as to accumulate controlled aliquots of the coating precursor vapors in the precursor vapor reservoirs;

adding the controlled aliquots of the coating precursor vapors to a process chamber without using a carrier gas, the process chamber having a vacuum control valve to control an amount of vacuum applied to the process chamber;

wherein the vacuum control valve is closed to isolate the process chamber during the adding of the controlled aliquots of the coating precursor vapors to the process chamber, and wherein the closure of the vacuum control valve is further maintained so that the controlled aliquots of the coating precursor vapors are simultaneously present in the process chamber and so that the total pressure of the process chamber results from equalization of the coating precursor vapors that are added to the process chamber.

12. A method in accordance with claim 11, further comprising:
applying heat to at least one of said coating precursors, to produce at least one of said coating precursor vapors.

13. A method in accordance with claim 11, wherein at least one of said coating precursors is a catalyst.

14. A method in accordance with claim 11, further comprising:
furnishing a plasma species to said process chamber.

15. A method in accordance with claim 11, wherein the process chamber has a pressure of about 0.1 Torr to about 3 Torr during each period of vapor flow.

16. A method in accordance with claim 11, wherein the process chamber has a temperature of about 20 degrees Celsius to about 60 degrees Celsius.

* * * * *